(12) United States Patent
Tang et al.

(10) Patent No.: US 12,149,170 B2
(45) Date of Patent: Nov. 19, 2024

(54) POWER SUPPLY CIRCUIT AND FIELD EMISSION ELECTRON SOURCE

(71) Applicant: NuRay Technology Co., Ltd., Suzhou (CN)

(72) Inventors: Huaping Tang, Suzhou (CN); Jinsong Pan, Suzhou (CN); Zhanfeng Qin, Suzhou (CN); Xiangyu Yin, Suzhou (CN); Yangwei Zhan, Suzhou (CN)

(73) Assignee: NuRay Technology Co., Ltd., Jiangsu (CN)

( * ) Notice: Subject to any disclaimer, the term of this patent is extended or adjusted under 35 U.S.C. 154(b) by 128 days.

(21) Appl. No.: 17/772,579

(22) PCT Filed: Apr. 17, 2020

(86) PCT No.: PCT/CN2020/085343
§ 371 (c)(1),
(2) Date: Apr. 28, 2022

(87) PCT Pub. No.: WO2021/082363
PCT Pub. Date: May 6, 2021

(65) Prior Publication Data
US 2023/0036712 A1    Feb. 2, 2023

(30) Foreign Application Priority Data
Oct. 30, 2019    (CN) .......................... 201911045808.0

(51) Int. Cl.
*H03K 17/10*    (2006.01)
*H02M 3/158*    (2006.01)
*H01J 35/06*    (2006.01)

(52) U.S. Cl.
CPC .......... *H02M 3/158* (2013.01); *H03K 17/102* (2013.01); *H01J 35/065* (2013.01)

(58) Field of Classification Search
None
See application file for complete search history.

(56) References Cited

U.S. PATENT DOCUMENTS 3,160,807 A * 12/1964 Packard .................. G05F 1/595
                                                    327/540
3,761,799 A *  9/1973 Shuey ..................... G05F 1/595
                                                    327/535

(Continued)

FOREIGN PATENT DOCUMENTS

CN    1043829 A    7/1990
CN    1043829 C    6/1999

(Continued)

OTHER PUBLICATIONS

Japanese Office Action for JP Application No. 2021-570282 dated Nov. 22, 2022 (9 Pages).

(Continued)

*Primary Examiner* — Thomas J. Hiltunen
(74) *Attorney, Agent, or Firm* — Merchant & Gould P.C.

(57) ABSTRACT

A power supply circuit and a field emission electron source are provided. The power supply circuit includes: field effect transistors $S_i$ coupled in series via drains and sources in sequence, wherein $1 \leq i \leq n$, $n \geq 2$, and wherein a source of $S_1$ is coupled to a negative electrode of a voltage source, and a drain of $S_n$ is used as an output terminal of the power supply circuit to couple to a load; a first group of diodes $D_{1j}$ coupled in series; a first group of resistors $R_{1j}$, $2 \leq j \leq n$; and a current feedback module configured to adjust an internal resistance of the field effect transistors $S_i$, coupled in series in sequence, so as to cause a current passing through the load to be constant; wherein the field effect transistors $S_i$, $1 \leq i \leq n$, operate in a constant current region.

16 Claims, 3 Drawing Sheets

(56) References Cited

U.S. PATENT DOCUMENTS

| | | | | |
|---|---|---|---|---|
| 4,628,226 | A | * | 12/1986 | Kurz ................... H01J 37/073 |
| | | | | 315/102 |
| 4,751,408 | A | * | 6/1988 | Rambert ............ H03K 17/102 |
| | | | | 327/581 |
| 5,148,064 | A | * | 9/1992 | Kevorkian ........... H03K 17/74 |
| | | | | 327/427 |
| 5,847,515 | A | | 12/1998 | Lee et al. |
| 6,815,845 | B1 | * | 11/2004 | McCallum ......... H02M 7/5387 |
| | | | | 361/84 |
| 8,492,978 | B2 | * | 7/2013 | True .................... H01J 37/241 |
| | | | | 315/105 |
| 8,760,214 | B2 | * | 6/2014 | Biela ................... H03K 17/102 |
| | | | | 327/430 |
| 8,912,840 | B2 | * | 12/2014 | Aggeler .............. H03K 17/102 |
| | | | | 327/430 |
| 10,110,142 | B2 | * | 10/2018 | Outram ................ H02M 7/217 |
| 11,128,261 | B2 | * | 9/2021 | Ranta ...................... H03F 3/16 |
| 11,212,902 | B2 | * | 12/2021 | De Antonis ............. H05G 1/56 |
| 11,784,641 | B2 | * | 10/2023 | Mehrotra ............. H03K 17/161 |
| | | | | 327/427 |
| 11,830,698 | B2 | * | 11/2023 | Tang .................... H01J 35/065 |

FOREIGN PATENT DOCUMENTS

| | | |
|---|---|---|
| CN | 105356753 A | 2/2016 |
| CN | 108566080 A | 9/2018 |
| CN | 110828265 A | 2/2020 |
| JP | 10163835 A | 6/1998 |
| JP | 200233648 A | 1/2002 |
| JP | 4864456 B2 | 11/2011 |

OTHER PUBLICATIONS

PCT International Search Report for PCT Application No. PCT/CN2020/085343 mailed Jul. 31, 2020 (8 pages, with English translation).

PCT Written Opinion for PCT Application No. PCT/CN2020/085343 mailed Jul. 31, 2020 (5 pages).

Chinese Office Action for CN Application No. 201911045808.0 mailed Apr. 8, 2020 (13 pages, with English translation).

\* cited by examiner

the present disclosure provides a power supply circuit

POWER SUPPLY CIRCUIT AND FIELD EMISSION ELECTRON SOURCE

CROSS-REFERENCE TO RELATED APPLICATION

This application is a National Stage Application of International Application No. PCT/CN2020/085343, filed on Apr. 17, 2020 which claims priority to Chinese Application No. 201911045808.0 filed on Oct. 30, 2019, all of the contents of which are incorporated herein by reference in their entirety.

TECHNICAL FIELD

The present disclosure relates to a field of electron source emission technology, and more specifically, to a power supply circuit and a field emission electron source using the power supply circuit.

BACKGROUND

A performance of a power supply circuit is critical to a performance of an electronic device. For example, in a field emission electron source product, a performance of the field emission electron source may decrease when a current applied to the field emission electron source circuit changes.

A solid may contain a large number of electrons, which are bound inside the solid due to an attraction of nucleus. Under a normal condition, these electrons do not have enough energy to escape from a surface of an object. Only under an action of a certain external energy or by a method of eliminating electron binding, the electrons may escape from an interior of the solid to a vacuum through the surface. A system capable of producing a large number of electrons directionally in the vacuum is called an electron source. A method is to suppress a surface potential barrier of a material by relying on an external electric field, so as to reduce and narrow the potential barrier. When a width of the potential barrier is narrow enough to be comparable to an electron wavelength, an electron tunneling effect begins to work, and free electrons may smoothly penetrate the surface potential barrier and enter the vacuum. This phenomenon of pulling electrons out of the solid surface using a strong external electric field is a field emission phenomenon. This type of electron source is called a field emission electron source. Research shows that when a field strength of the external electric field reaches $10^6$, an apparent electron emission phenomenon may already occur. There is no time delay in the field emission, and a response speed may reach a microsecond level, that is, the field emission electron source may be turned on and off instantaneously.

Therefore, it is required that a circuit applied to the field emission electron source may maintain a stable current and may respond instantaneously.

SUMMARY

The present disclosure provides a power supply circuit and a field emission electron source using the power supply circuit.

According to an aspect of the present disclosure, there is provided a power supply circuit, including: field effect transistors $S_i$ coupled in series via drains and sources in sequence, wherein $1 \leq i \leq n$, i and n are natural numbers, $n \geq 2$, and wherein a source of $S_1$ is coupled to a negative electrode of a voltage source, and a drain of $S_n$ is used as an output terminal of the power supply circuit to couple to a load; a first group of diodes $D_{1i}$ coupled in series, wherein $1 \leq i \leq n$, i and n are natural numbers, $n \geq 2$, and wherein $D_{11}$ is coupled in parallel between a gate of $S_2$ and the negative electrode of the voltage source, and $D_{1n}$ is coupled in parallel between a gate of the $S_n$ and the drain of the $S_n$, the remaining $D_{1i}$ are coupled in parallel between gates of the $S_i$ and gates of $S_{i+1}$ when $n>2$; a first group of resistors $R_{1j}$, $2 \leq j \leq n$, wherein $R_{1j}$ are coupled in parallel between the gates of the $S_i$ and the sources of the $S_i$, and wherein a value of j corresponds to a value of i, and i and j are natural numbers; and a current feedback module configured to adjust an internal resistance of the field effect transistors $S_i$, $1 \leq i \leq n$, coupled in series in sequence, so as to cause a current passing through the load to be constant; wherein the field effect transistors $S_i$, $1 \leq i \leq n$, operate in a constant current region.

In some embodiments, the field effect transistor $S_1$ is an N-channel enhancement type field effect transistor, and the field effect transistors $S_i$, $2 \leq i \leq n$, are N-channel depletion type field effect transistors.

In some embodiments, the current feedback module includes: a detection unit coupled in series with the load and configured to detect the current passing through the load, wherein the load is coupled to the output terminal of the power supply circuit; and a control signal generation unit configured to generate a control signal according to the current passing through the load, and apply the control signal to a gate of the field effect transistor $S_1$.

In some embodiments, the control signal generation unit is configured to: compare the current passing through the load with a set current value; increase a gate voltage of the $S_1$ in response to the current passing through the load being less than the set current value; and reduce the gate voltage of the $S_1$ in response to the current passing through the load being greater than the set current value.

In some embodiments, the detection unit comprises a resistance element, an inductance element, or a Hall sensor element.

In some embodiments, the control signal generation unit includes an operational amplifier, a microcontroller, an FPGA, or a single-chip microcomputer.

In some embodiments, the power supply circuit is configured to replace the first group of diodes $D_{1i}$ coupled in series with parallel structures coupled in series, wherein each of the parallel structures comprises a resistor and a capacitor, $1 \leq i \leq n$, i and n are natural numbers, and $n \geq 2$.

In some embodiments, the power supply circuit further includes a second group of diodes $D_{2k}$ coupled in parallel, $2 \leq k \leq n$, wherein anodes of the $D_{2k}$ are coupled to the gates of the $S_i$, and cathodes of the $D_{2k}$ are coupled to the sources of the $S_i$, and wherein a value of k corresponds to the value of i, k and n are natural numbers.

In some embodiments, the power supply circuit further includes: a third group of diode, wherein a cathode of the third group of diode is coupled to the drain of the field effect transistor $S_n$, and an anode of the third group of diode is coupled to one terminal of a second resistor; and the second resistor, wherein another terminal of the second resistor is coupled to ground.

According to another aspect of the present disclosure, there is provided a multipoint field emission electron source, including: at least one power supply circuit according to the embodiments described above; a gate assembly; and at least one cathode; wherein the gate assembly is coupled to a positive electrode of a voltage source in the power supply circuit, and the positive electrode of the voltage source is coupled to ground, and wherein the at least one cathode corresponds to the at least one power supply circuit respectively, and the at least one cathode is coupled to one or more output terminals of the at least one power supply circuit, the plurality of cathodes are arranged in parallel with the gate assembly, and a field emission electric field is formed between each of the cathodes and the gate assembly.

BRIEF DESCRIPTION OF THE DRAWINGS

The following description of the embodiments of the present disclosure in conjunction with the accompanying drawings will make the above and other objectives, features, and advantages of the embodiments of the present disclosure more clear. It should be noted that throughout the drawings, the same elements are represented by the same or similar reference signs.

DETAILED DESCRIPTION OF EMBODIMENTS

Figure 1:
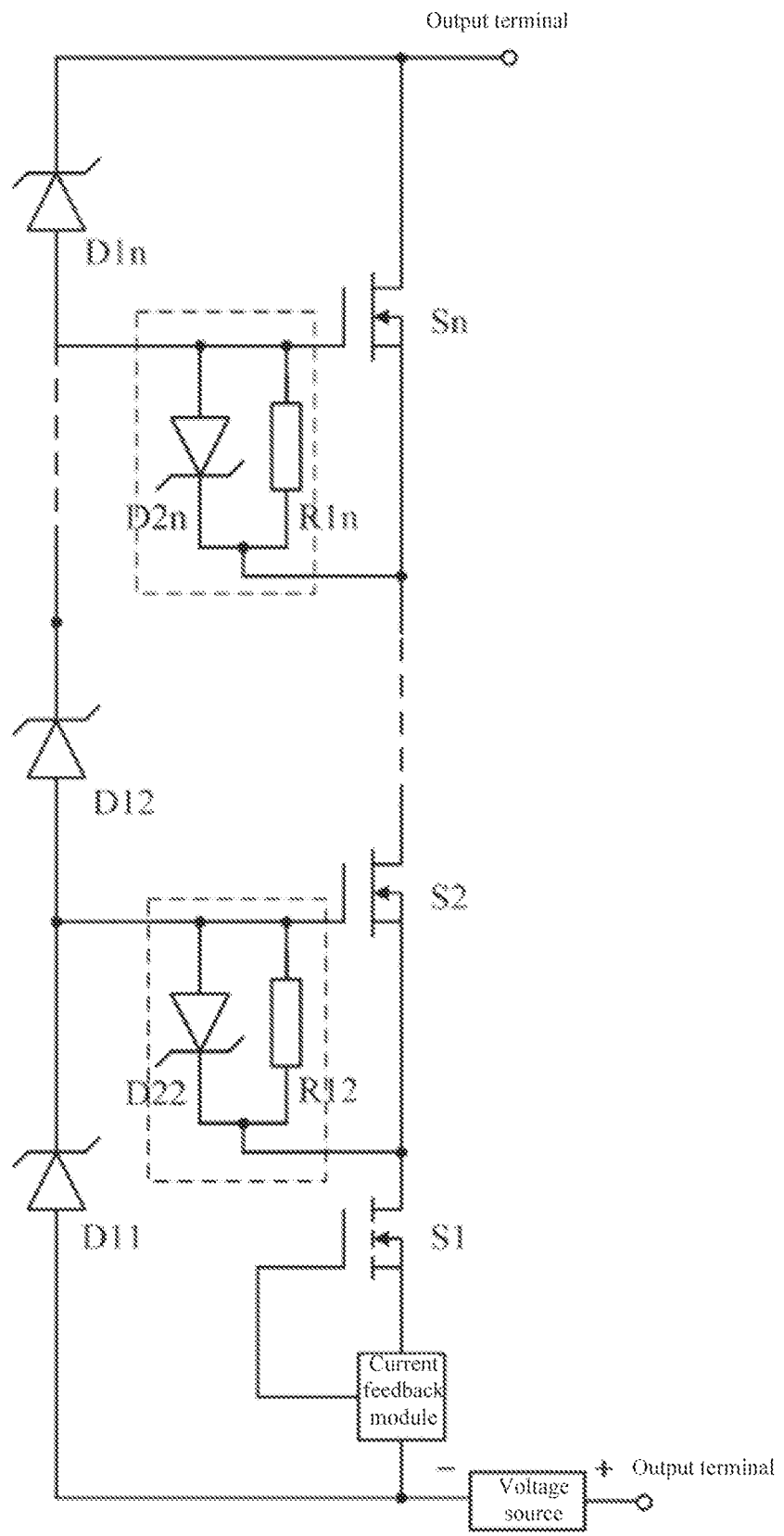
FIG. 1 shows a circuit diagram of a power supply circuit according to an embodiment of the present disclosure.

In order to make objectives, technical solutions and advantages in the embodiments of the present disclosure more apparent, the technical solutions in the embodiments of the present disclosure will be clearly and completely described below with reference to the drawings of the embodiments of the present disclosure. The embodiments described in detail hereinafter make up only a subset of the embodiments contemplated in view of the present disclosure. Based on the embodiments of the present disclosure, all other embodiments obtained by those of ordinary skilled in the art without carrying out inventive effort also fall within the protection scope of the present disclosure. In the following description, some specific embodiments are provided as illustrative examples for descriptive purposes, and should not be construed as limiting the present disclosure. When it may cause confusion in the understanding of the present disclosure, conventional structures or configurations may be omitted. It should be noted that the shapes and dimensions of components in the figure do not necessarily reflect actual sizes and/or ratios, but merely illustrate the content of the embodiments of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "coupled to" or "coupled to" may mean that two components are directly coupled, or that two components are coupled via one or more other components. In addition, these two components may be connected or coupled by wired or wireless means.

In an existing developed field emission X-ray source, a field emission electron source is adopted to generate an electron beam by a field emission, and the field emission electron source may include a part for generating the electron beam (called a cathode) and a part for generating a control electric field. A solid field emission requires a strong electric field, which is also an essential element of a field emission cathode. Through an improvement of a cathode material, a field emission voltage threshold may be greatly reduced to reach a level of several volts per micron (V/um). Therefore, a gate control voltage of the field emission electron source is directly related to a distance between the cathode and the gate, which may be controlled in the order of tens of micrometers (um) to millimeters (mm) by different process methods. Therefore, an operating voltage of the field emission electron source may be several thousand volts (kV).

The embodiments of the present disclosure first propose a power supply circuit, which may be used as a power supply of the above-mentioned field emission electron source. However, it should be understood that the power supply circuit in the embodiments of the present disclosure may also be applied to other occasions, such as a field of electric vacuum.

FIG. 1 shows a circuit diagram of a power supply circuit according to an embodiment of the present disclosure. As shown in FIG. 1, the power supply circuit according to the embodiment of the present disclosure mainly includes field effect transistors $S_i$ coupled in series via drains and sources in sequence, $1 \leq i \leq n$, $n \geq 2$, where i and n are natural numbers. In FIG. 1, a source of $S_1$ is coupled to a negative electrode of a voltage source, a positive electrode of the voltage source is used as an output terminal of the power supply circuit, a drain of the $S_1$ is coupled to a source of $S_2$, a drain of the $S_2$ is coupled to a source of $S_3$, and so on, a drain of $S_{n-1}$ is coupled to a source of $S_n$, and a drain of the $S_n$ is used as the other output terminal of the power supply circuit. A load may be coupled between the two output terminals of the power supply circuit.

As shown in FIG. 1, the power supply circuit further includes diodes (a first group of diodes) $D_{1i}$ coupled in series, $1 \leq i \leq n$, $n \geq 2$, where i and n are natural numbers. As shown in FIG. 1, a diode $D_{11}$ is coupled in parallel between a gate of the $S_2$ and the negative electrode of the voltage source, and $D_{1n}$ is coupled in parallel between a gate of the $S_n$ and the drain of the $S_n$. When $n>2$, the remaining $D_{1i}$ are coupled in parallel between gates of the $S_i$ and gates of $S_{i+1}$. For example, the diode $D_{12}$ is coupled in parallel between the gate of the $S_2$ and a gate of the $S_3$, the diode $D_{13}$ is coupled in parallel between the gate of the $S_3$ and a gate of the $S_4$, and so on.

As shown in FIG. 1, the power supply circuit further includes a current feedback module. One terminal of the current feedback module is coupled to the source of the $S_1$, and the other terminal of the current feedback module is coupled to the negative electrode of the voltage source, so as to detect a current of a loop in which the load is located. A control signal output by the current feedback module is applied to the gate of the $S_1$. The current feedback module may adjust an internal resistance of the field effect transistors $S_i$, $1 \leq i \leq n$, coupled in series in sequence, so as to cause a current passing through the load to be constant.

According to the embodiments of the present disclosure, the power supply circuit may further include diodes (a second group of diodes) $D_{2k}$ and resistors (a first group of resistors) $R_{1j}$ coupled in parallel, $2 \leq k \leq n$, $2 \leq j \leq n$, where k, j and n are all natural numbers greater than or equal to 2. The diodes (the second group of diodes) $D_{2k}$ are included in a dashed box, which indicates that the diodes $D_{2k}$ are optional components.

As shown in in FIG. 1, a value of k corresponds to a value of j, and corresponding diodes $D_{2k}$ and resistors $R_{1j}$ are coupled in parallel with each other and then coupled as a whole in parallel between the gates of the field effect transistors $S_i$ and the sources of the field effect transistors $S_i$. Anodes of the diodes $D_{2k}$ are coupled to the gates of the field effect transistors $S_i$, and cathodes of the diodes $D_{2k}$ are coupled to the sources of the field effect transistors $S_i$. For example, a diode $D_{22}$ and a resistor $R_{12}$ are coupled in parallel between the gate of the $S_2$ and the source of the $S_2$, an anode of the $D_{22}$ is coupled to the gate of the $S_2$, a cathode of the $D_{22}$ is coupled to the source of the $S_2$, and so on.

According to the embodiments of the present disclosure, the current feedback module may further include a detection unit and a control signal generation unit. The detection unit is coupled in series with a load coupled to the output terminal of the power supply circuit, so as to detect the current passing through the load. The control signal generation unit may generate a control signal according to the current passing through the load and apply the control signal to the gate of the field effect transistor $S_1$, and the current passing through the load may be adjusted via the field effect transistors $S_i$, 2≤i≤n, coupled in series, which will be described below in detail in conjunction with specific examples.

The detection unit may be a resistance element, an inductance element or a Hall sensor element, and the embodiments of the present disclosure are not limited thereto. The control signal generation unit may be an operational amplifier, a microcontroller, an FPGA or a single-chip microcomputer, and the embodiments of the present disclosure are not limited thereto.

According to the embodiments of the present disclosure, the control signal generation unit is configured to compare the current passing through the load with a set current value, increase a gate voltage of the $S_1$ when the current passing through the load is less than the set current value, and reduce the gate voltage of the $S_1$ when the current passing through the load is greater than the set current value.

According to the embodiments of the present disclosure, the field effect transistor $S_1$ is an N-channel enhancement type field effect transistor, and the field effect transistors $S_i$, 2≤i≤n, are N-channel depletion type field effect transistors. In addition, all the field effect transistors $S_i$, 1≤i≤n, mainly operate in a constant current region.

In the embodiments of the present disclosure, by using a feedback adjustment of current by the series-coupled field effect transistors operating in the constant current region, a constant output current of the power supply circuit may be achieved, and a high voltage and a fast response may be provided.

The power supply circuit will be described in more detail below in conjunction with specific examples.

Figure 2:
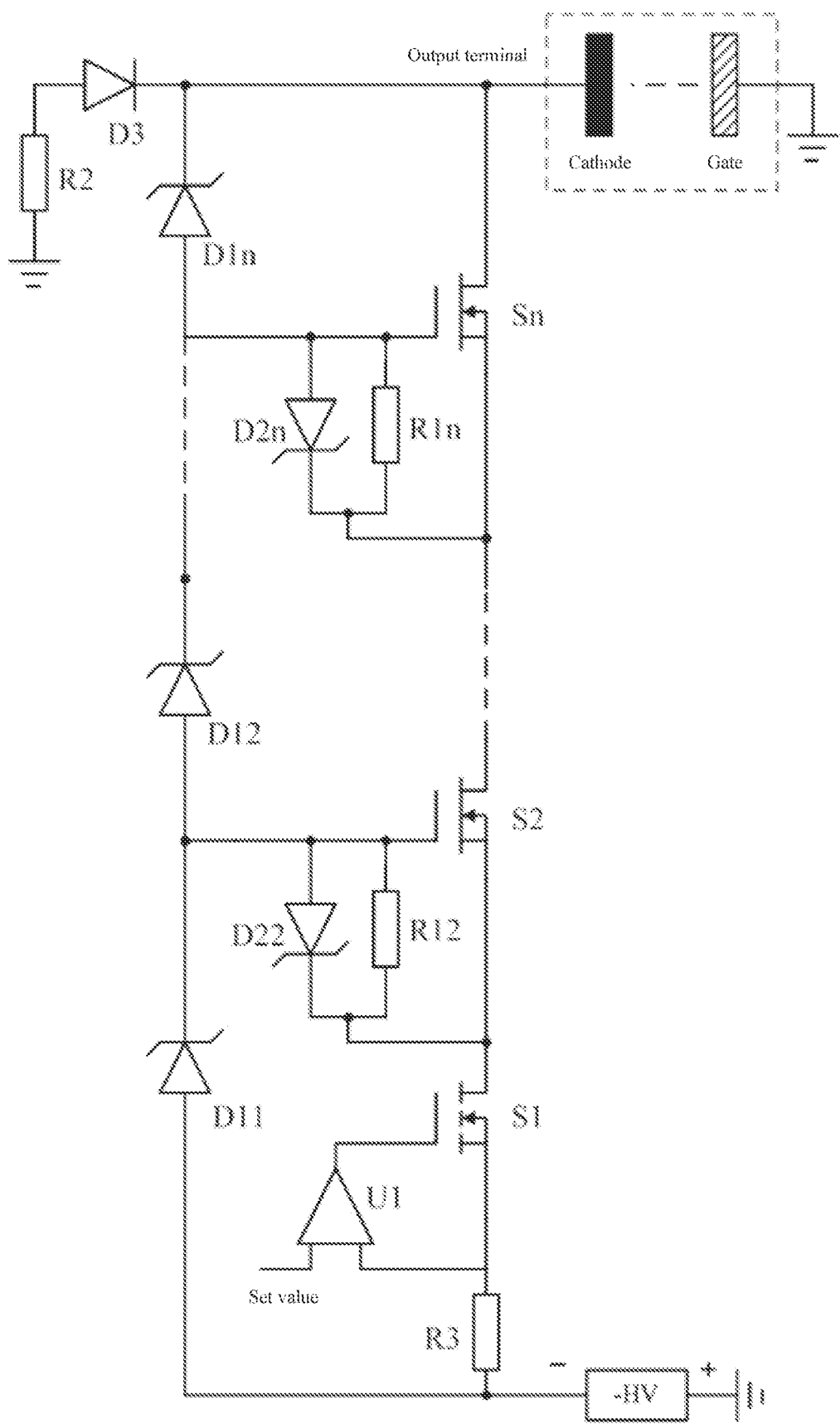
FIG. 2 shows a circuit diagram of a single-channel field emission electron source according to an embodiment of the present disclosure.

FIG. 2 shows a circuit diagram of a single-channel field emission electron source according to an embodiment of the present disclosure. As shown in FIG. 2, the circuit includes n field effect transistors $S_1, S_2, \ldots, S_n$ coupled in series in sequence. $S_1$ is an N-channel enhancement type field effect transistor, and $S_2$ to $S_n$ are N-channel depletion type field effect transistors. $D_{11}, D_{12}, \ldots, D_{1n}$ are transient voltage suppressors (TVS) or zener diodes. $D_{22}, \ldots, D_{2n}$ are zener diodes. $D_3$ is a high-voltage diode. $R_2$ is a bleeder resistor (second resistor), $R_3$ is a current detection resistor, $R_{12} \ldots R_{1n}$ are conventional resistors. $U_1$ is an operational amplifier. The voltage source is a negative high voltage source −HV with a negative electrode for outputting a negative high voltage and a positive electrode coupled to the ground.

One terminal of the current detection resistor $R_3$ is coupled to a negative terminal of the negative high voltage source −HV, the source of the field effect transistor $S_1$ is coupled to the other terminal of the current detection resistor $R_3$, the drain of the $S_1$ is coupled to the source of the $S_2$, the drain of the $S_2$ is coupled to the source of the $S_3, \ldots$, the drain of the $S_n$ is used as an output of the power supply circuit and is coupled to the cathode of the field emission electron source. The anode of the zener diode $D_{22}$ is coupled to the gate of the $S_2$, the cathode of the $D_{22}$ is coupled to the source of the $S_2$, and the $R_{12}$ is coupled in parallel to both ends of the $D_{22}$, so as to form a parallel network to prevent a gate-source voltage $U_{gs}$ of the $S_2$ from exceeding a gate-source voltage limit of the field effect transistor. A parallel network formed by $D_{23}$ and $R_{13}$ is coupled between a gate of the $S_3$ and the source of the $S_3$, and so on, and a parallel network formed by $D_{2n}$ and $R_{1n}$ is coupled between a gate of the $S_n$ and the source of the $S_n$.

An anode of the $D_{11}$ is coupled to a cathode of the negative high voltage source −HV, and a cathode of the $D_{11}$ is coupled to the gate of the $S_2$. An anode of the $D_{1n}$ is coupled to the gate of the $S_n$, and a cathode of the $D_{1n}$ is coupled to the cathode of the field emission electron source. When n≥2, the anode of the $D_{12}$ is coupled to the gate of the $S_2$, the cathode of the $D_{12}$ is coupled to the gate of the $S_3$, and $D_{13}, \ldots, D_{1n-1}$ are coupled to the field effect transistors $S_2, \ldots, S_n$ respectively in a manner similar to that of the $D_{12}$ being coupled to the $S_2$ and the $S_3$.

One terminal of the resistor $R_2$ is coupled to the ground GND, the other terminal of the resistor $R_2$ is coupled to an anode of the diode $D_3$, and a cathode of the $D_3$ is coupled to the cathode of the field emission electron source. In this manner, it is possible to discharge electric charges accumulated at the cathode of the field emission electron source through a loop formed by the $D_3$ and the $R_2$ when the field emission electron source does not operate.

An equivalent internal resistance between the source and the drain of the enhancement type field effect transistor $S_1$ is denoted as $R_{s1}$, equivalent internal resistances between the sources and the drains of the depletion type field effect transistors $S_2 \sim S_n$ are denoted as $R_{s2} \sim R_{sn}$, and an equivalent resistance of the field emission electron source is denoted as $R_x$. A potential of the −HV is Vh, and a potential of the GND is 0V (the −HV and the GND are not limited to a specific potential in a practical application process). The current flowing through the field emission electron source may be fed back using the current detection resistor $R_3$ coupled in series with the field emission electron source, and the detection current may flow through the detection resistor $R_3$. A feedback voltage $V_{test}$ is applied to an inverting input terminal of the operational amplifier, and a voltage $V_{set}$ preset according to the set current value is applied to a non-inverting input terminal of the operational amplifier. The preset voltage $V_{set}$ may be set to 0, so that each field effect transistor is in the pinch-off region and the circuit is in a non-operation state.

When the circuit is in an initial state, the $V_{set}$ is set to 0V. Due to an action of the operational amplifier, a gate-source potential difference of the $S_1$ approaches 0V The $S_1$ is an N-channel enhancement type field effect transistor, and a pinch-off voltage of the $S_1$ is positive, then $S_1$ is in the pinch-off region. $S_2$ to $S_n$ are N-channel depletion type field effect transistors, and pinch-off voltages of the $S_2$ to the $S_n$ are negative. In a loop formed by the $R_2$, the $D_3$, the drain of the $S_n$, the source of the $S_n, \ldots$, the drain of the $S_2$, the source of the $S_2$, the $R_{12}$, the $D_{22}$ and the $D_{11}$, a source potential of the $S_2$ is slightly greater than a gate potential of the $S_2$ due to an action of the $R_{12}$ and the $D_{22}$, and the equivalent internal resistance $R_{s2}$ between the source and the drain of the $S_2$ is very large. And so on, in a loop formed by the $R_2$, the $D_3$, the drain of the $S_n$, the source of the $S_n$, ..., the drain of the $S_i$, the source of the $S_i$, the $R_{1i}$, the $D_{2i}$ and the $D_{1i-1} \sim D_{11}$, a source potential of the $S_i$ is slightly greater than a gate potential of the $S_i$ due to an action of the $R_{1i}$ and the $D_{2i}$, and the equivalent internal resistance $R_{si}$ between the source and the drain of the $S_i$ is very large, where $2 \le i \le n$, i is a natural number, and n is a natural number greater than or equal to 2. In a loop formed by $R_2$, $D_3$ and $S_n \sim S_1$, a sum of resistance values of the $R_{s1}$ to the $R_{sn}$ is much larger than that of $R_2$ ($R_2$ reaches an MΩ level and is coupled in parallel with the field emission electron source), then a voltage difference obtained by $S_1 \sim S_n$ is approximately equal to Vh. A cumulative breakdown voltage of $D_{11}$, $D_{12}$, ..., $D_{1n}$ is close to a value of the Vh. In this case, in a loop formed by $R_2$, $D_3$ and $D_{1n} \sim D_{11}$, $D_{1n} \sim D_{11}$ share a voltage of the Vh according to their respective voltage characteristics, then the voltage difference between the drain and the source of the $S_n$ is also approximately equal to a voltage difference between the cathode and the anode of the $D_{1n}$ (the source potential of the $S_n$ is a few volts higher than the gate potential of the $S_n$ due to an existence of the $R_{1n}$ and the $D_{2n}$). Therefore, a maximum voltage value between the drain and the source of each field effect transistor is determined by the electrical characteristic of the corresponding TVS. The drain-source voltage of each field effect transistor may be balanced using a variety of circuits, not limited to the TVS. A zener diode or a parallel connection of resistor and capacitor may also be used.

When $V_{set}$ is greater than $V_{test}$, due to the action of the operational amplifier, the gate voltage of the $S_1$ may gradually rise, and the circuit starts to operate. The $S_1$ operates in the constant current region, and $R_{s1}$ becomes smaller. The voltage borne by the series-connected depletion type field effect transistors $S_2$ to $S_n$ may be automatically adjusted according to a variation of the voltage between the drain and the source of the $S_1$, and no additional control is required.

A source potential of the $S_2$ is denoted as $V_s$, and a drain potential of the $S_2$ is denoted as $V_d$. When $R_{s1}$ becomes smaller, $V_s$ becomes smaller. At this time, in a circuit network formed by the $D_{22}$, the $R_{12}$, the drain of the $S_1$, the source of the $S_1$, the $R_3$ and the $D_{11}$, a potential difference between the $R_{12}$ and the $D_{22}$ becomes smaller (that is, a difference between the source potential and the gate potential of the $S_2$ becomes smaller), then the equivalent resistance $R_{s2}$ of the source and the drain of the $S_2$ becomes smaller, and the $V_d$ becomes smaller accordingly. The series-connected N-channel depletion type field effect transistors $S_3$, ..., $S_n$ are similarly adjusted step by step, and the drain potential of the $S_n$ becomes smaller (the resistance of $R_{s3}$ to $R_{sn}$ also becomes smaller). That is, a cathode potential of the field emission electron source becomes smaller, and the voltage difference between the cathode and the gate of the field emission electron source becomes larger. When the potential difference between the cathode and the gate of the field emission electron source is greater than the critical value of field emission, the cathode may emit electrons, and a current is generated in the circuit.

The current passing through the $R_3$ is denoted as I. When a cumulative sum of the resistance values of $R_{s1}$ and $R_{s2} \sim R_{sn}$ is in a similar order of magnitude to a resistance value of Rx, $I \approx Vh/(Rx+R_{s1}+R_{s2}+ \ldots +R_{sn}+R_3)$.

When the equivalent resistance Rx of the field emission electron source changes, the drain-source voltage $V_{ds}$ of the field effect transistor $S_n$ changes. Through the feedback network formed by $R_{1n}$ and $D_{2n}$, the voltage difference between the gate and the source of the $S_n$ changes, and the internal resistance $R_{sn}$ of the field effect transistor $S_n$ changes accordingly. This adaptive process may ensure that a total value of $(Rx+R_{s1}+R_{s2}+ \ldots +R_{sn}+R_3)$ remains unchanged when $R_x$ changes, so that the constant current function of the circuit may be achieved.

In the embodiments of the present disclosure, the field effect transistors $S_2$ to $S_n$ are optionally implemented by N-channel depletion type field effect transistors, and no additional control circuit is required to control $S_2$ to $S_n$. The series structure may change its own internal resistance in conjunction with the change of $S_1$, and has a self-adaptive ability. This adaptive way of changing the internal resistance enables the circuit to reach a constant current state in a very short time (hundreds of nanoseconds).

In the embodiments of the present disclosure, the field effect transistor $S_1$ is implemented by an N-channel enhancement type field effect transistor, which may significantly simplify the circuit structure compared with a P-channel enhancement type field effect transistor.

In addition, as shown in FIG. 2, a bleeder circuit is further provided in the power supply circuit of the embodiments of the present disclosure, which mainly includes a high-voltage diode (a third group of diode) $D_3$ and a resistor $R_2$. A cathode of the diode $D_3$ is coupled to the cathode of the field emission electron source, and the electrons accumulated at the cathode may be discharged through the bleeder circuit. Moreover, in the initial state of the circuit, an initial potential may be provided to the cathode through the bleeder circuit, otherwise the cathode potential is suspended and the circuit may not operate normally.

The power supply circuit provided by the embodiments of the present disclosure apts to expand, and may be combined with the field emission electron source to form a multipoint field emission electron source.

Figure 3:
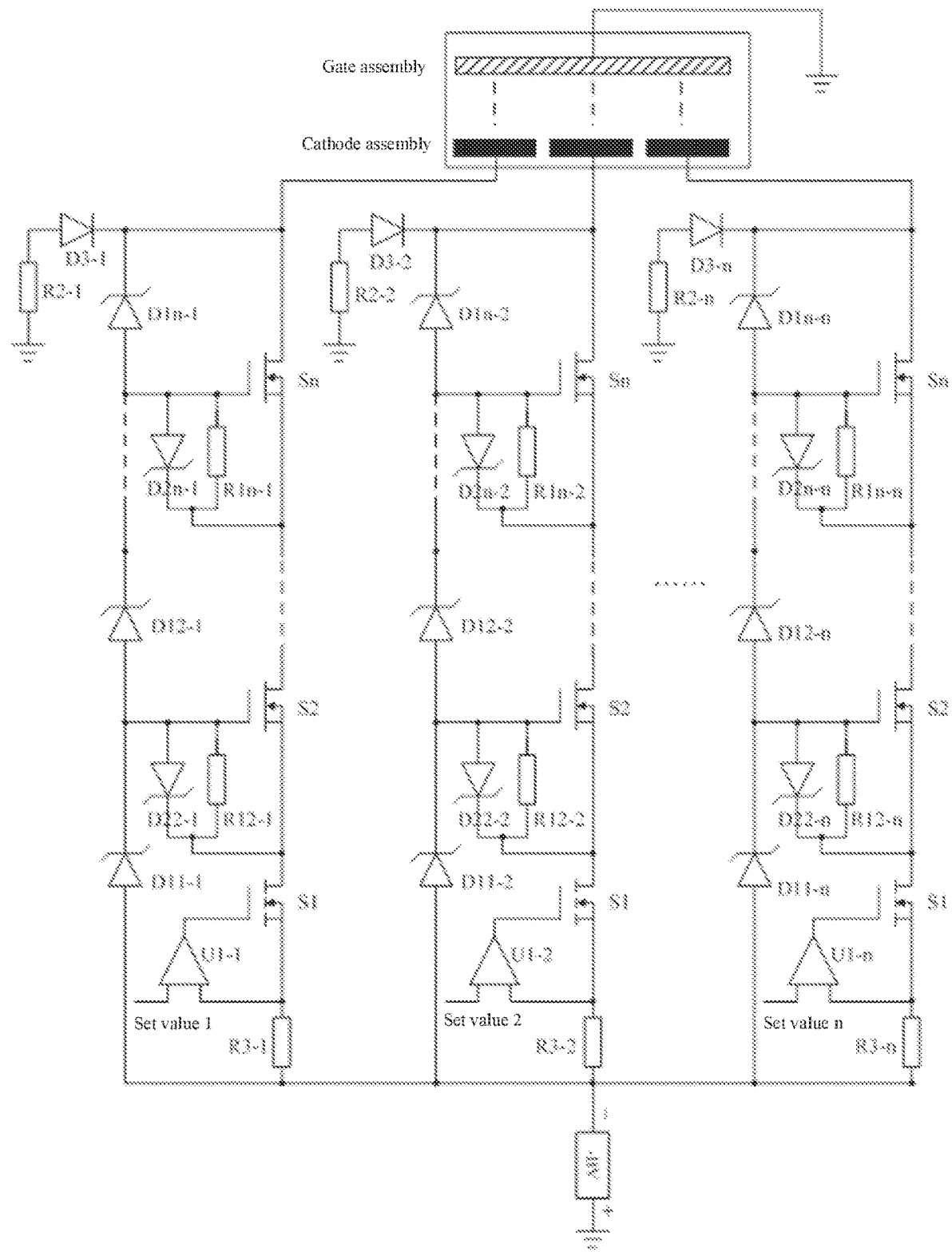
FIG. 3 shows a circuit diagram of a multipoint field emission electron source according to an embodiment of the present disclosure.

FIG. 3 shows a circuit diagram of a multipoint field emission electron source according to an embodiment of the present disclosure. As shown in FIG. 3, the multipoint field emission electron source includes at least one power supply circuit of the embodiments described with reference to FIG. 1 or FIG. 2. Each power supply circuit may constitute a channel, and the power supply circuits are coupled in parallel. At least one channel may be turned off by setting at least one set value of a set value 1, a set value 2, ..., a set value n to 0, so that the channels may operate independently of each other.

As shown in FIG. 3, the multipoint field emission electron source further includes a gate assembly and at least one cathode. The gate assembly is coupled to the ground. The at least one cathode corresponds to at least one power supply circuit respectively, and the at least one cathode is coupled to the output terminal of the at least one power supply circuit. The plurality of cathodes are arranged in parallel with the gate assembly, and a field emission electric field is formed between each cathode and the gate assembly.

According to the embodiments of the present disclosure, the internal resistance of the N-channel enhancement type field effect transistor $S_1$ may be adjusted through the closed-loop current detection, so that the remaining N-channel depletion type field effect transistors $S_2$ to $S_n$ may automatically adjust the internal resistance accordingly. In this way, the field emission electron source may reach a constant current state in nanoseconds.

Most field effect transistors usually have an effective operation voltage below 1 kV, and a field effect transistor with an effective operation voltage above 1 kV is very rare and expensive. Through the series connection of the N-channel enhancement type field effect transistor and the N-channel depletion type field effect transistor, a withstand voltage requirement for each level of field effect transistors may be greatly reduced, a selection range of the field effect transistor may be broadened, and a cost of the field emission source control circuit may be reduced. The withstand voltage of a single field effect transistor in the embodiment of the present disclosure is controllable, and tends to increase the reliability of circuit operation by retaining a sufficient withstand voltage design margin.

So far, the present disclosure has been described in conjunction with the preferred embodiments. It should be understood that those skilled in the art may make various other changes, substitutions and additions without departing from the spirit and scope of the embodiments of the present disclosure. Therefore, the scope of the embodiments of the present disclosure is not limited to the above specific embodiments, but should be defined by the appended claims.

What is claimed is:

1. A power supply circuit, comprising:
   field effect transistors Si coupled in series via drains and sources in sequence, wherein $1 \leq i \leq n$, i and n are natural numbers, $n \geq 2$, and wherein a source of S1 is coupled to a negative electrode of a voltage source, and a drain of Sn is used as an output terminal of the power supply circuit to couple to a load;
   a first group of diodes D1i coupled in series, wherein $1 \leq i \leq n$, i and n are natural numbers, $n \geq 2$, and wherein D11 is coupled in parallel between a gate of S2 and the negative electrode of the voltage source, D11 is not coupled to a gate of the field effect transistor S1, and D1n is coupled in parallel between a gate of the Sn and the drain of the Sn, the remaining D1i are coupled in parallel between gates of the Si and gates of Si+1 when $n>2$;
   a first group of resistors R1j, $2 \leq j \leq n$, wherein R1j are coupled in parallel between the gates of the Si and the sources of the Si, and wherein a value of j corresponds to a value of i, and i and j are natural numbers; and
   a current feedback module configured to adjust an internal resistance of the field effect transistors Si, $1 \leq i \leq n$, coupled in series in sequence, so as to cause a current passing through the load to be constant;
   wherein the field effect transistors Si, $1 \leq i \leq n$, operate in a constant current region,
   wherein the current feedback module comprises:
   a detection unit coupled in series with the load and configured to detect the current passing through the load, wherein the load is coupled to the output terminal of the power supply circuit;
   a control signal generation unit configured to generate a control signal according to the current passing through the load, and apply the control signal to the gate of the field effect transistor $S_1$.

2. The power supply circuit according to claim 1, wherein the field effect transistor $S_1$ is an N-channel enhancement type field effect transistor, and the field effect transistors $S_i$, $2 \leq i \leq n$, are N-channel depletion type field effect transistors.

3. The power supply circuit according to claim 2, further comprising:
   a second group of diodes $D_{2k}$ coupled in parallel, $2 \leq k \leq n$, wherein anodes of the $D_{2k}$ are coupled to the gates of the $S_i$, and cathodes of the $D_{2k}$ are coupled to the sources of the $S_i$, and wherein a value of k corresponds to the value of i, k and n are natural numbers.

4. The power supply circuit according to claim 2, further comprising:
   a third group of diode, wherein a cathode of the third group of diode is coupled to the drain of the field effect transistor Sn, and an anode of the third group of diode is coupled to one terminal of a second resistor; and
   the second resistor, wherein another terminal of the second resistor is coupled to ground.

5. A multipoint field emission electron source, comprising:
   at least one power supply circuit according to claim 2;
   a gate assembly; and
   at least one cathode;
   wherein the gate assembly is coupled to a positive electrode of the voltage source in the power supply circuit, and the positive electrode of the voltage source is coupled to ground, and
   wherein the at least one cathode corresponds to the at least one power supply circuit respectively, and the at least one cathode is coupled to one or more output terminals of the at least one power supply circuit, the at least one cathode is arranged in parallel with the gate assembly, and a field emission electric field is formed between the and each of the at least one cathode.

6. The power supply circuit according to claim 1, wherein the control signal generation unit is configured to:
   compare the current passing through the load with a set current value;
   increase a gate voltage of the $S_1$ in response to the current passing through the load being less than the set current value; and
   reduce the gate voltage of the $S_1$ in response to the current passing through the load being greater than the set current value.

7. The power supply circuit according to claim 1, wherein the power supply circuit is configured to replace the first group of diodes $D_{1i}$ coupled in series with parallel structures coupled in series, wherein each of the parallel structures comprises a resistor and a capacitor, $1 \leq i \leq n$, i and n are natural numbers, and $n \geq 2$.

8. The power supply circuit according to claim 7, further comprising:
   a second group of diodes $D_{2k}$ coupled in parallel, $2 \leq k \leq n$, wherein anodes of the $D_{2k}$ are coupled to the gates of the $S_i$, and cathodes of the $D_{2k}$ are coupled to the sources of the $S_i$, and wherein a value of k corresponds to the value of i, k and n are natural numbers.

9. The power supply circuit according to claim 7, further comprising:
   a third group of diode, wherein a cathode of the third group of diode is coupled to the drain of the field effect transistor $S_n$, and an anode of the third group of diode is coupled to one terminal of a second resistor; and
   the second resistor, wherein another terminal of the second resistor is coupled to ground.

10. A multipoint field emission electron source, comprising:
    at least one power supply circuit according to claim 7;
    a gate assembly; and
    at least one cathode;
    wherein the gate assembly is coupled to a positive electrode of the voltage source in the power supply circuit, and the positive electrode of the voltage source is coupled to ground, and
    wherein the at least one cathode corresponds to the at least one power supply circuit respectively, and the at least one cathode is coupled to one or more output terminals of the at least one power supply circuit, the at least one cathode is arranged in parallel with the gate assembly, and a field emission electric field is formed between the gate assembly and each of the at least one cathode.

11. The power supply circuit according to claim 1, further comprising:
  a second group of diodes $D_{2k}$ coupled in parallel, $2 \leq k \leq n$, wherein anodes of the $D_{2k}$ are coupled to the gates of the $S_i$, and cathodes of the $D_{2k}$ are coupled to the sources of the $S_i$, and wherein a value of k corresponds to the value of i, k and n are natural numbers.

12. The power supply circuit according to claim 11, further comprising:
  a third group of diode, wherein a cathode of the third group of diode is coupled to the drain of the field effect transistor $S_n$, and an anode of the third group of diode is coupled to one terminal of a second resistor; and
  the second resistor, wherein another terminal of the second resistor is coupled to ground.

13. A multipoint field emission electron source, comprising:
  at least one power supply circuit according to claim 11;
  a gate assembly; and
  at least one cathode;
  wherein the gate assembly is coupled to a positive electrode of the voltage source in the power supply circuit, and the positive electrode of the voltage source is coupled to ground, and
  wherein the at least one cathode corresponds to the at least one power supply circuit respectively, and the at least one cathode is coupled to one or more output terminals of the at least one power supply circuit, the at least one cathode is arranged in parallel with the gate assembly, and a field emission electric field is formed between the gate assembly and each of the at least one cathode.

14. The power supply circuit according to claim 1, further comprising:
  a third group of diode, wherein a cathode of the third group of diode is coupled to the drain of the field effect transistor $S_n$, and an anode of the third group of diode is coupled to one terminal of a second resistor; and
  the second resistor, wherein another terminal of the second resistor is coupled to ground.

15. A multipoint field emission electron source, comprising:
  at least one power supply circuit according to claim 1;
  a gate assembly; and
  at least one cathode;
  wherein the gate assembly is coupled to a positive electrode of the voltage source in the power supply circuit, and the positive electrode of the voltage source is coupled to ground, and
  wherein the at least one cathode corresponds to the at least one power supply circuit respectively, and the at least one cathode is coupled to one or more output terminals of the at least one power supply circuit, the at least one cathode is arranged in parallel with the gate assembly, and a field emission electric field is formed between the gate assembly and each of the at least one cathode.

16. A multipoint field emission electron source, comprising:
  at least one power supply circuit according to claim 14;
  a gate assembly; and
  at least one cathode;
  wherein the gate assembly is coupled to a positive electrode of the voltage source in the power supply circuit, and the positive electrode of the voltage source is coupled to ground, and
  wherein the at least one cathode corresponds to the at least one power supply circuit respectively, and the at least one cathode is coupled to one or more output terminals of the at least one power supply circuit, the at least one cathode is arranged in parallel with the gate assembly, and a field emission electric field is formed between the gate assembly and each of the at least one cathode.

* * * * *